(12) United States Patent
Oikawa

(10) Patent No.: US 8,116,163 B2
(45) Date of Patent: *Feb. 14, 2012

(54) SEMICONDUCTOR MEMORY DEVICE

(75) Inventor: Takeshi Oikawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/949,456

(22) Filed: Nov. 18, 2010

(65) Prior Publication Data

US 2011/0063015 A1 Mar. 17, 2011

Related U.S. Application Data

(63) Continuation of application No. 12/382,980, filed on Mar. 27, 2009, now Pat. No. 7,859,923.

(30) Foreign Application Priority Data

Mar. 31, 2008 (JP) .................................. 2008-90529

(51) Int. Cl.
*G11C 17/18* (2006.01)

(52) U.S. Cl. ..................... 365/225.7; 365/200

(58) Field of Classification Search ............... 365/225.7, 365/200
See application file for complete search history.

(56) References Cited

U.S. PATENT DOCUMENTS

| 6,178,125 | B1 | 1/2001 | Niiro |
| 7,411,845 | B2 | 8/2008 | Kodama |
| 7,859,923 | B2 * | 12/2010 | Oikawa ......................... 365/200 |

FOREIGN PATENT DOCUMENTS

JP 2001-023393 A 1/2001

* cited by examiner

*Primary Examiner* — Huan Hoang
(74) *Attorney, Agent, or Firm* — Foley & Lardner LLP (57) ABSTRACT

The present invention provides a semiconductor memory device that includes: a fuse circuit having multiple fuse elements; and a fuse selection circuit connected to an internal address signal line that receives an address signal externally inputted. The fuse circuit is connected to the fuse selection circuit to receive an output from the fuse selection circuit, is supplied with an externally inputted trigger signal that permits nonvolatile recording of the fuse elements, and, in response to the output and the trigger signal, records the fuse element corresponding to the internal address signal line among the plurality of fuse elements while recording at least one of the plurality of fuse elements other than the fuse element thus recorded.

8 Claims, 8 Drawing Sheets

SEMICONDUCTOR MEMORY DEVICE

CROSS-REFERENCE TO RELATED PATENT APPLICATIONS

This application is a continuation of application Ser. No. 12/382,980, filed Mar. 27, 2009, now pending, which claims the benefit of priority from the prior Japanese Patent Application No. 2008-090529, filed Mar. 31, 2008, the entire contents of which are incorporated herein by reference. This application claims only subject matter disclosed in the parent application and therefore presents no new matter.

BACKGROUND OF THE INVENTION

1. Field of the Invention

The present invention relates to a semiconductor memory device, and particularly relates to a semiconductor device the failure of which can be redressed based on a test result.

2. Description of the Related Art

In recent years, a semiconductor memory device has become smaller and grown in capacity, and needs to be subjected to a screening test several times. In the conduct of the screening test, a semiconductor memory device has conventionally been redressed through replacement of a separately-arising defective memory cell with a spare memory cell by fuse cutting (such a redress technique is hereinafter referred to as replacement redress). To carry out such replacement redress several times, however, addition and review of a test circuit and addition of a dedicated signal line for controlling replacement redress are required. Consequently, a chip size becomes larger, which results in a cost increase. What is needed to avoid this is a several-time replacement redress circuit not requiring external control and operations. A conventional semiconductor memory device having a replacement redress circuit is described in Japanese Patent Application Publication No. 2001-23393, for example.

Figure 6:
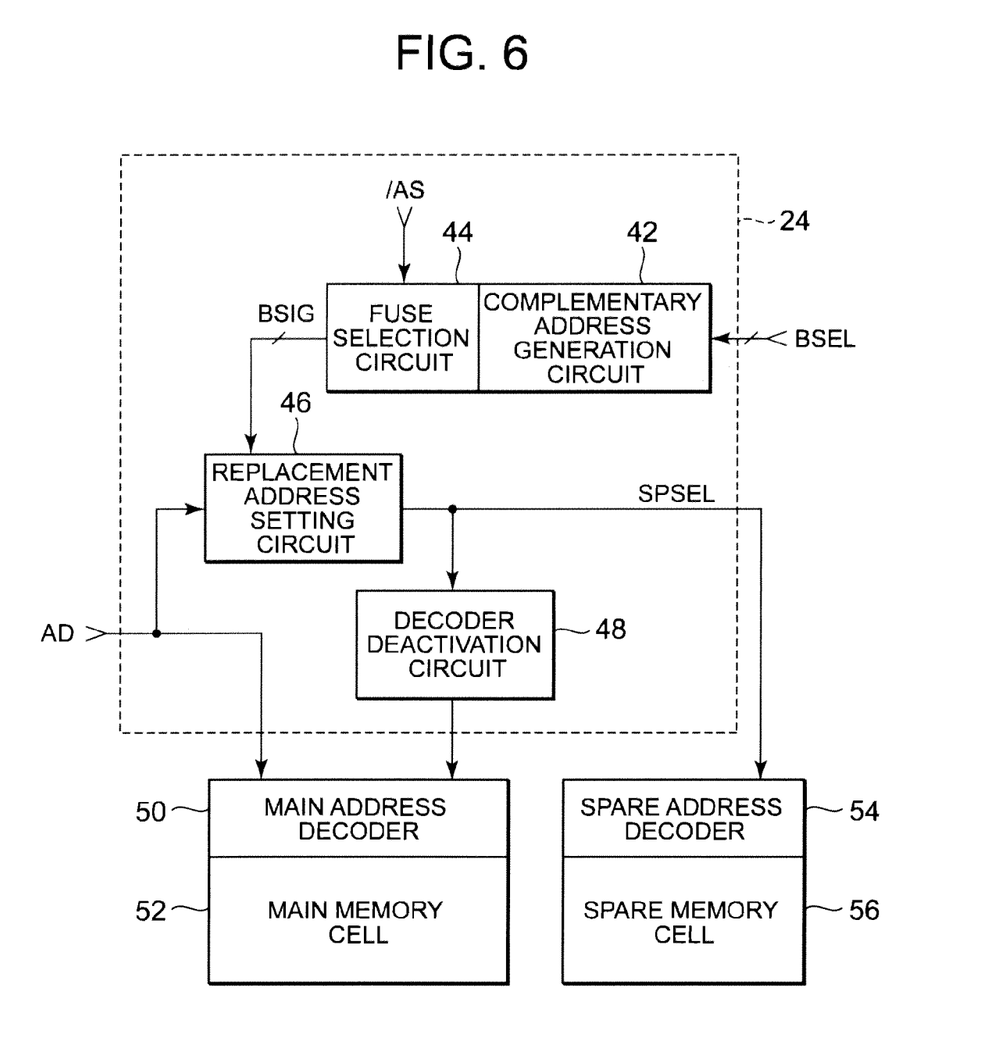
FIG. 6 is a block diagram of a conventional replacement control circuit.

FIG. 6 is a block diagram for explaining a configuration of a conventional replacement control circuit 24. The replacement control circuit 24 includes a complementary address generation circuit 42, a fuse selection circuit 44, a replacement address setting circuit 46, and a decoder deactivation circuit 48. The complementary address generation circuit 42 receives a fuse selection address signal BSEL provided to select a fuse for storing an address to be replaced, outputs the signal as it is upon a first conduct of replacement, and outputs a complementary address upon a second conduct of replacement. The fuse selection circuit 44 outputs a fuse selection signal BSIG in response to the output from the complementary address generation circuit 42 and an address strobe signal /AS. The replacement address setting circuit 46 outputs a spare selection signal SPSEL in response to an address signal AD externally inputted and the fuse selection signal BSIG. The decoder deactivation circuit 48 deactivates a main address decoder 50 when the spare selection signal SPSEL is activated. When the spare selection signal SPSEL is activated, a spare address decoder 54 decodes the spare selection signal SPSEL and activates a corresponding spare memory cell 56.

Figure 7:
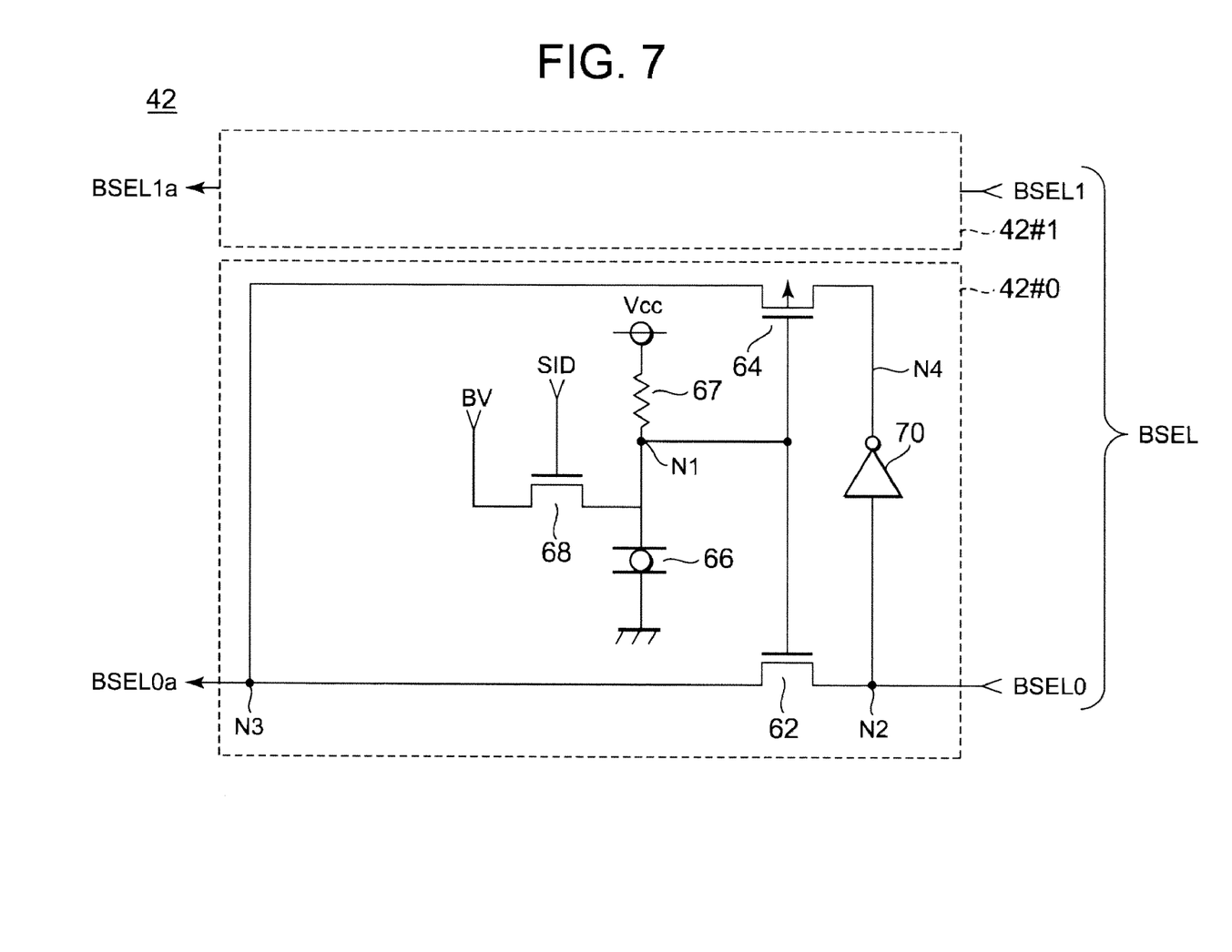
FIG. 7 is a diagram of a conventional complementary address generation circuit.

FIG. 7 is a circuit diagram showing a configuration of the complementary address generation circuit 42 in FIG. 6. The complementary address generation circuit 42 has a circuit 42#0 and a circuit 42#1. The circuit 42#0 outputs a signal BSEL0a upon receipt of a fuse selection address signal BSEL0, and the circuit 42#1 outputs a signal BSEL1a upon receipt of a fuse selection address signal BSEL1. The circuit 42#0 has: an n-channel MOS transistor 68 that is activated upon receipt of an identification signal SID at a gate thereof when first redundancy replacement is complete and conveys a high voltage BV to a node N1; a resistor 67 that is connected between a power node to which a power supply potential Vcc is provided and the node N1; and an antifuse 66 that is connected between the node N1 and a ground node. The antifuse is a type of electrical fuse and has a property of becoming conductive between electrodes by being blown. In other words, the antifuse 66 becomes conductive when the high voltage BV is applied to the node N1, which causes the node N1 to have the approximately same potential as the ground node. Hence, the node N1 is at the H level before a first fuse blowing, but is at the L level after the first fuse blowing. To be more specific, the node N1 is at the L level when a second fuse blowing is needed as a result of a subsequent test performed after undergoing operational states such as normal read/write operations, other test operations, standby mode or shut-down after leaving replacement redress mode. The circuit 42#0 further has: an n-channel MOS transistor 62 being connected between nodes N2 and N3 and having a gate connected to the node N1; an inverter 70 that receives and reverses the fuse selection address signal BSEL0 provided to the node N2 and outputs the reversed fuse selection address signal BSEL0 to a node N4; and a p-channel MOS transistor 64 being connected between the nodes N4 and N3 and having a gate connected to the node N1.

The node N3 outputs the signal BSEL0a being the output of the complementary address generation circuit 42. FIG. 7 shows only the fuse selection address signal BSEL0 in detail; however, in the similar way, the similar circuit 42#1 is provided with the fuse selection address signal BSEL1 and outputs the signal BSEL1a correspondingly. Since the node N1 is at the H level when the first fuse blowing is to be performed, the n-channel MOS transistor 62 is conductive, and therefore the fuse selection address signal BSEL0 provided to the node N2 is conveyed to the node N3 as it is. On the other hand, since the node N1 is at the L level when the second fuse blowing is to be performed as described before, the n-channel MOS transistor 62 is nonconductive, and therefore the p-channel MOS transistor 64 connected between the nodes N4 and N3 becomes conductive instead. Consequently, the fuse selection address signal BSEL0 is reversed by the inverter 70.

Figure 8:
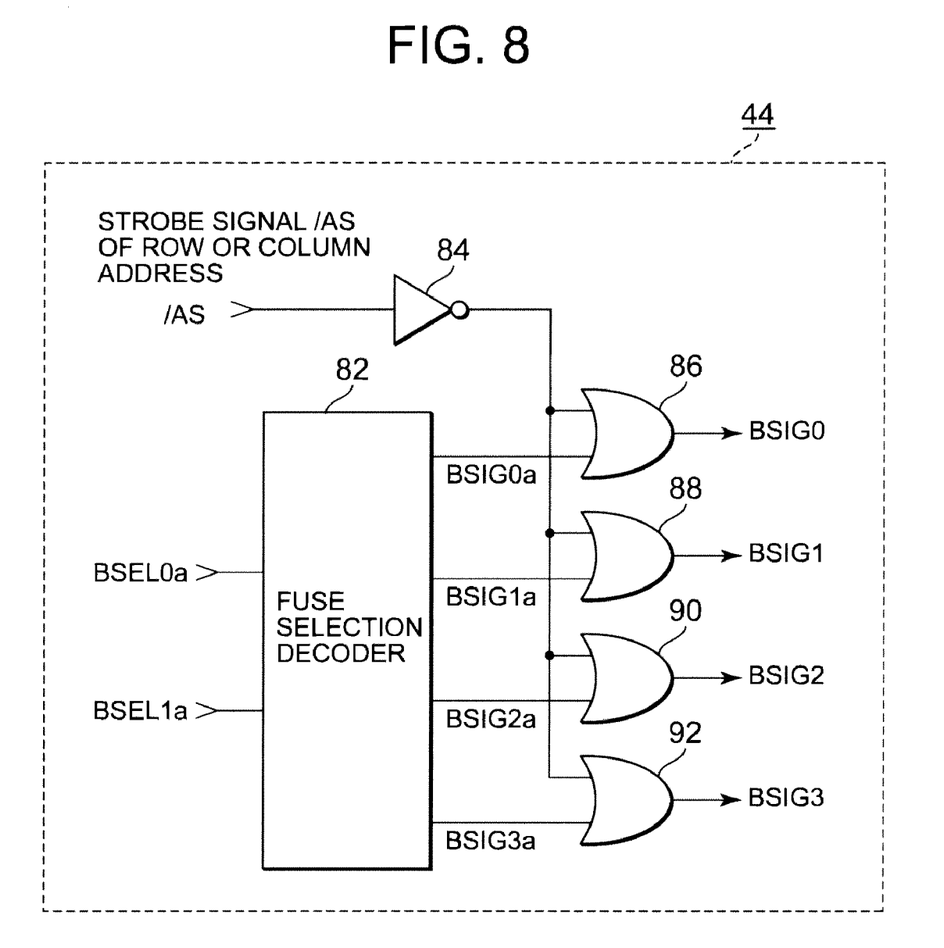
FIG. 8 is a diagram of a conventional fuse selection circuit.

FIG. 8 is a circuit diagram showing a configuration of the fuse selection circuit 44 in FIG. 6. The fuse selection circuit 44 has: a fuse selection decoder 82 that receives and decodes the signals BSEL0a and BSEL1a, which are the output signals of the complementary address generation circuit 42; an inverter 84 that receives and reverses the strobe signal /AS of a row or column address; a NOR circuit 86 that outputs a fuse selection signal BSIG0 upon receipt of an output signal BSIG0a of the fuse selection decoder 82 and the output signal of the inverter 84; a NOR circuit 88 that outputs a fuse selection signal BSIG1 upon receipt of an output signal BSIG1a of the fuse selection decoder 82 and the output signal of the inverter 84; a NOR circuit 90 that outputs a fuse selection signal BSIG2 upon receipt of an output signal BSIG2a of the fuse selection decoder 82 and the output signal of the inverter 84; and a NOR circuit 92 that outputs a fuse selection signal BSIG3 upon receipt of an output signal BSIG3a of the fuse selection decoder 82 and the output signal of the inverter 84. The fuse selection decoder 82 receives and decodes the signals BSEL0a and BSEL1a, and activates any one of the output signals BSIG0a to BSIG3a. The NOR circuits 86 to 92 activate all the fuse selection signals BSIG0 to BSIG3 upon activation of the strobe signal /AS when a row or column address is externally inputted. When the strobe signal /AS is deactivated, the NOR circuits 86 to 92 output, as the fuse selection signals BSIG0 to BSIG3, the signals BSIG0a to BSIG3a decoded in response to the fuse selection address signal BSEL externally provided.

As described above, the conventional technology requires a replacement information holding circuit to have a circuit which changes a selected fuse set when replacement redress is necessary. Moreover, the replacement information holding circuit also requires a special control circuit and control procedure for storing, in a nonvolatile manner, a fact that a first replacement redress process has been carried out and completed after completing replacement redress for the required number of defective word and bit lines, and the like, as the first replacement redress. Since circuits to be added in this manner are repeatedly placed for each required replacement redress, a chip size increases and the control procedure becomes more complicated.

SUMMARY OF THE INVENTION

A semiconductor memory device of an aspect of the present invention is configured including: a fuse circuit having multiple fuse elements; and a fuse selection circuit connected to an internal address signal line that receives an address signal externally inputted. The fuse circuit is connected to the fuse selection circuit to receive an output from the fuse selection circuit, is supplied with an externally inputted trigger signal that permits nonvolatile recording of the fuse elements, and, in response to the output and the trigger signal, records the fuse element corresponding to the internal address signal line among the plurality of fuse elements while recording at least one of the plurality of fuse elements other than the fuse element thus recorded.

Such a configuration eliminates the need for a dedicated replacement information holding circuit and a dedicated fuse selection circuit as well as a control procedure using a fuse selection address signal, which have been conventionally necessary. Accordingly, it is possible to securely hold replacement information and implement several-time replacement, with a simple configuration.

According to the embodiment, it is made possible to configure a semiconductor memory device capable of accurately performing a replacement process several times with a simple circuit and a simple control procedure.

DESCRIPTION OF THE PREFERRED EMBODIMENTS

Specific examples of embodiments will hereinafter be described with reference to the drawings. All of the following descriptions are one of examples, and do not limit the present invention of the application. Those skilled in the art can understand and carry out the present invention in an aspect with appropriate changes and addition within the scope of the present invention of the application.

Figure 1:
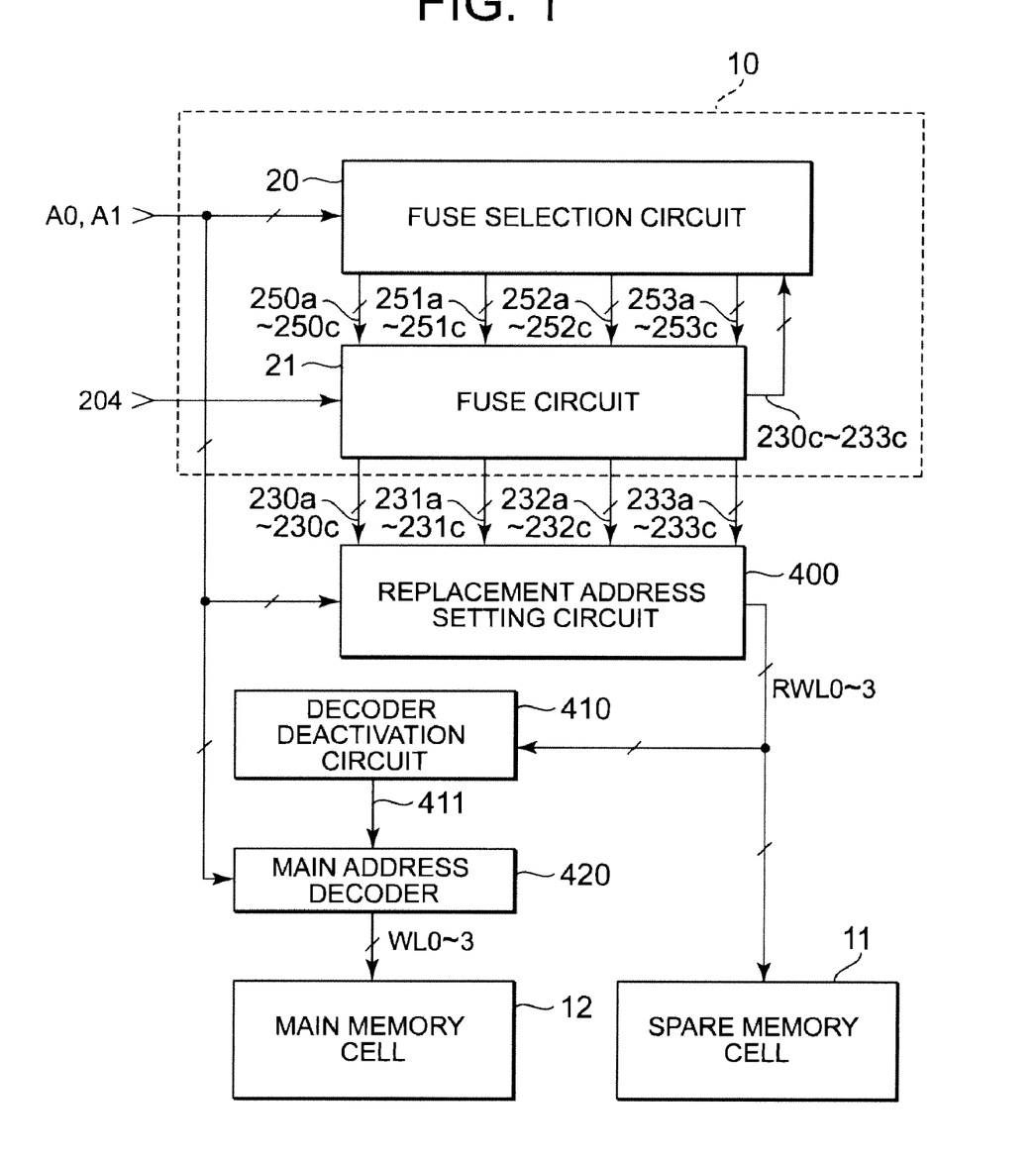
FIG. 1 is an entire block diagram showing a configuration of a first embodiment.

FIG. 1 is a block diagram showing a configuration of a first embodiment. A semiconductor memory device of the present invention includes a replacement control circuit 10 which further includes a fuse selection circuit 20 and a fuse circuit 21, a replacement address setting circuit 400, a decoder deactivation circuit 410, a main address decoder 420, a main memory cell 12, and a spare memory cell 11. Address signals A0 and A1 inputted externally are connected to the fuse selection circuit 20 of the replacement control circuit 10, the replacement address setting circuit 400, and the main address decoder 420. A cut trigger signal 204 inputted externally is connected to the fuse circuit 21. The fuse selection circuit 20 and the fuse circuit 21 of the replacement control circuit 10 are connected to each other with cut selection signals 250a to 250c, 251a to 251c, 252a to 252c, and 253a to 253c. Enable fuse signals 230c to 233c are connected to the fuse selection circuit 20, and output signals 230a to 230c, 231a to 231c, 232a to 232c, and 233a to 233c are connected to the replacement address setting circuit 400. Output signals RWL0 to 3 of the replacement address setting circuit 400 are connected to the decoder deactivation circuit 410 and the spare memory cell 11. An output signal 411 of the decoder deactivation circuit 410 is connected to the main address decoder 420. Output signals WL0 to 3 of the main address decoder 420 are connected to the main memory cell 12.

Figure 2:
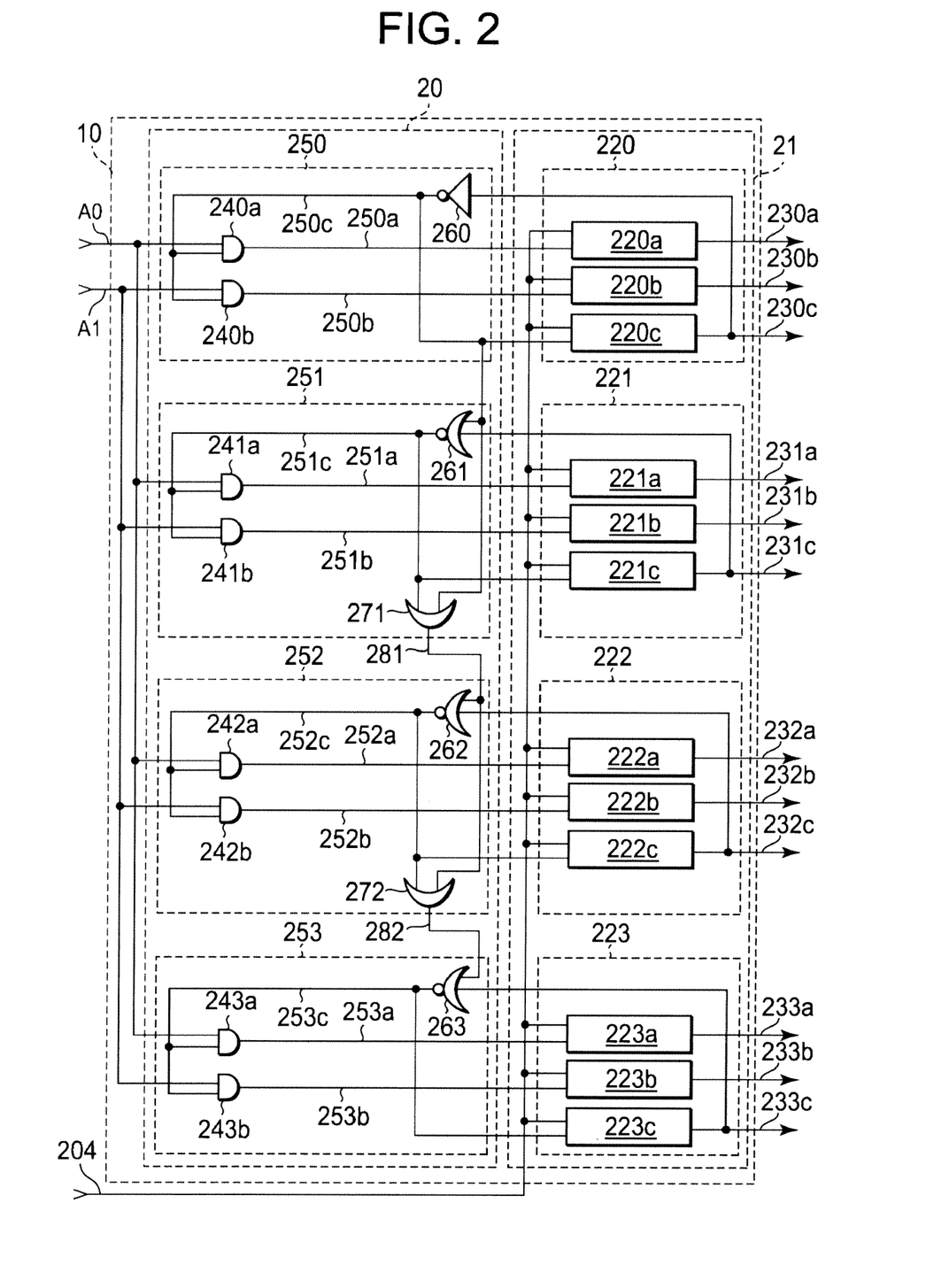
FIG. 2 is a replacement control circuit diagram of the first embodiment.

FIG. 2 is a circuit diagram of the fuse selection circuit 20 and a block diagram of the fuse circuit 21, both of which configure the replacement control circuit 10 in FIG. 1. FIG. 2 is configured of fuse selection circuits 250, 251, 252, and 253, and circuit blocks 220, 221, 222 and 223. The circuit blocks 220 to 223 are configured of fuse circuits 220a to 220c, 221a to 221c, 222a to 222c, and 223a to 223c, respectively. The fuse selection circuit 250 is configured of two-input AND circuits 240a and 240b and an inverter circuit 260. The fuse selection circuit 251 is configured of two-input AND circuits 241a and 241b, a two-input NOR circuit 261, and a two-input OR circuit 271. The fuse selection circuit 252 is configured of two-input AND circuits 242a and 242b, a two-input NOR circuit 262, and a two-input OR circuit 272. The fuse selection circuit 253 is configured of two-input AND circuits 243a and 243b, and a two-input NOR circuit 263. The address signals A0 and A1 externally inputted to the fuse selection circuit 250 and the circuit block 220 are connected to the two-input AND circuits 240a and 240b, respectively. The cut trigger signal 204 is connected to the fuse circuits 220a to 220c. The outputs 250a and 250b of the two-input AND circuits 240a and 240b are connected to the fuse circuits 220a and 220b, respectively. The enable fuse signal 230c is connected to the inverter 260, and the output 250c is connected to the two-input AND circuits 240a and 240b, the fuse circuit 220c, and the two-input NOR circuit 261 and the two-input OR circuit 271 of the fuse selection circuit 251.

The address signals A0 and A1 inputted to the fuse selection circuit 251 and the circuit block 221 are connected to the two-input AND circuits 241a and 241b, respectively. The cut trigger signal 204 is connected to the fuse circuits 221a to 221c. The outputs 251a and 251b of the two-input AND circuits 241a and 241b are connected to the fuse circuits 221a and 221b, respectively. The enable fuse signal 231c is connected to the two-input NOR signal 261. The output 251c is connected to the two-input AND circuits 241a and 241b, the fuse circuit 221c, and the two-input OR circuit 271. An output 281 of the two-input OR circuit 271 is connected to the two-input NOR circuit 262 and the two-input OR circuit 272 of the fuse selection circuit 252.

The address signals A0 and A1 inputted to the fuse selection circuit 252 and the circuit block 222 are connected to the two-input AND circuits 242a and 242b, respectively. The cut trigger signal 204 is connected to the fuse circuits 222a to 222c. The outputs 252a and 252b of the two-input AND circuits 242a and 242b are connected to the fuse circuits 222a and 222b, respectively. The enable fuse signal 232c is connected to the two-input NOR circuit 262. The output 252c is connected to the two-input AND circuits 242a and 242b, the fuse circuit 222c, and the two-input OR circuit 272. An output 282 of the two-input OR circuit 272 is connected to the two-input NOR circuit 263 of the fuse selection circuit 253.

The address signals A0 and A1 inputted to the fuse selection circuit 253 and the circuit block 223 are connected to the two-input AND circuits 243a and 243b, respectively. The cut trigger signal 204 is connected to the fuse circuits 223a to 223c. The outputs 253a and 253b of the two-input AND circuits 243a and 243b are connected to the fuse circuits 223a and 223b, respectively. The enable fuse signal 233c is inputted to the two-input NOR circuit 263, and an output 253c is connected to the two-input AND circuits 243a and 243b and the fuse circuit 223c.

Next, descriptions will be given of a configuration of the block 220 holding a first replacement address.

The block 220 is configured of the three fuse circuits 220a, 220b and 220c. The fuse circuit 220a is connected with the A0 cut selection signal 250a from the block 250 and the cut trigger signal 204, and outputs the A0 address fuse signal 230a. The fuse circuit 220b is connected with the A1 cut selection signal 250b from the block 250 and the cut trigger signal 204, and outputs the A1 address fuse signal 230b. The fuse circuit 220c is connected with the fuse use ban signal 250c from the block 250 and the cut trigger signal 204, and outputs the enable fuse signal 230c. A configuration of the block 221 holding a second replacement address is the same as the first one. The block 221 has the fuse circuits 221a, 221b and 221c, and outputs the A0 address fuse signal 231a, the A1 address fuse signal 231b, and the enable fuse signal 231c, respectively. A configuration of the block 222 holding a third replacement address is the same as the first one. The block 222 has the fuse circuits 222a, 222b, and 222c, and outputs the A0 address fuse signal 232a, the A1 address fuse signal 232b, and the enable fuse signal 232c, respectively. A configuration of the block 223 holding a fourth replacement address is the same as the first one. The block 223 has the fuse circuits 223a, 223b, and 223c, and outputs the A0 address fuse signal 233a, the A1 address fuse signal 233b, and the enable fuse signal 233c, respectively.

Figure 3:
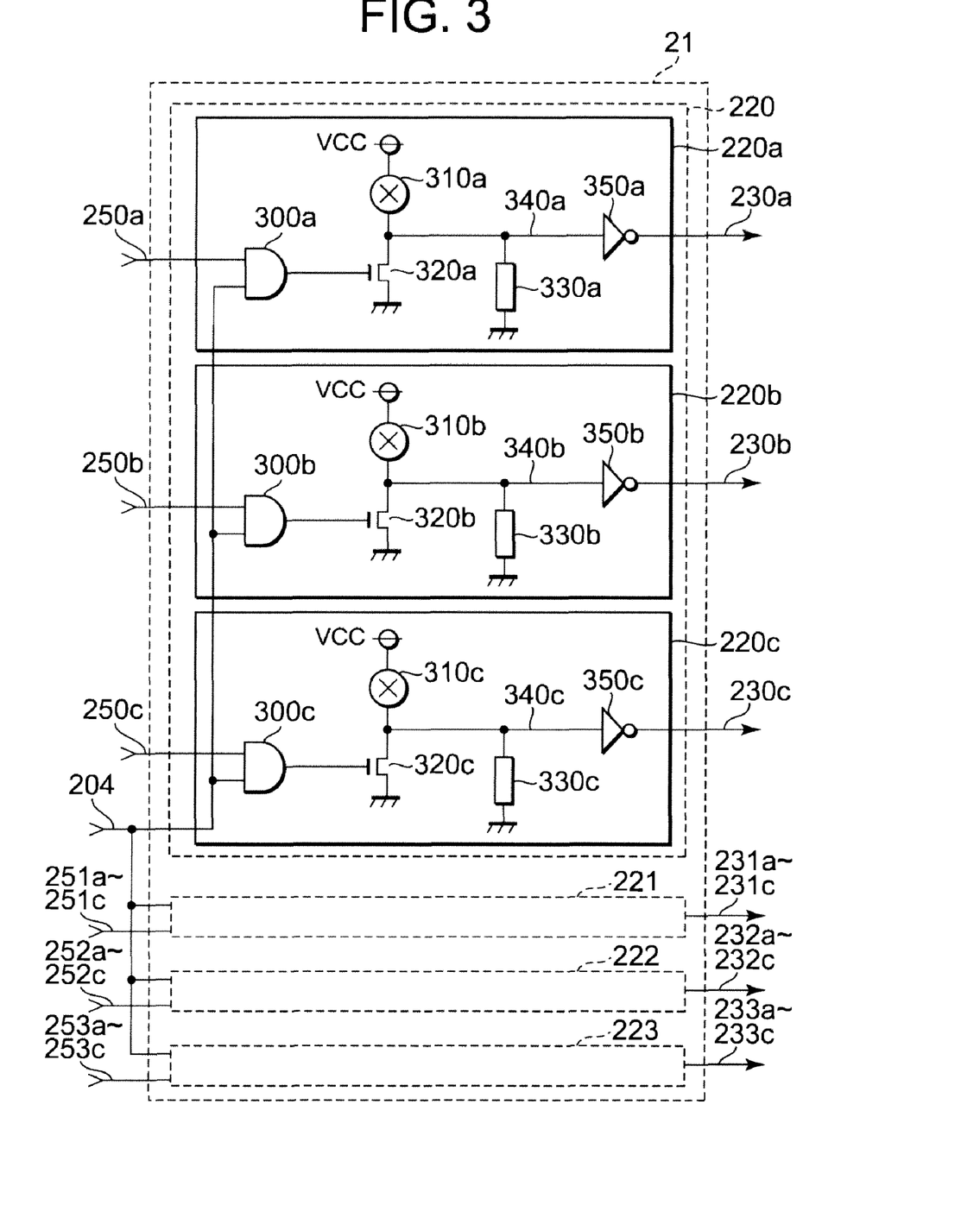
FIG. 3 is a fuse circuit diagram of the first embodiment.

FIG. 3 is a detailed circuit diagram of the fuse circuit block 21.

The block 21 is configured of the blocks 220 to 223. The block 220 is configured of the fuse circuits 220a to 220c which are configured of two-input AND circuits 300a to 300c, n-channel transistors 320a to 320c, electric fuses 310a to 310c, high resistors 330a to 330c, and inverters 350a to 350c, respectively. In the fuse circuit 220a, the cut selection signal 250a and the cut trigger signal 204 are connected to the two-input AND circuit 300a, and the output is connected to a gate of the n-channel transistor 320a. A source of the n-channel transistor 320a is connected to GND, and a drain node 340a is connected to the electric fuse 310a, the high resistor 330a, and the inverter 350a. The electric fuse 310a is connected to the node 340a and the power supply VCC. The high resistor 330a is connected to the node 340a and GND. Internal connection relations in the fuse circuits 220b and 220c are the same as that of the fuse circuit 220a. In addition, the internal configurations and the connection relations of the blocks 221 to 223 are the same as the block 220.

Figure 4:
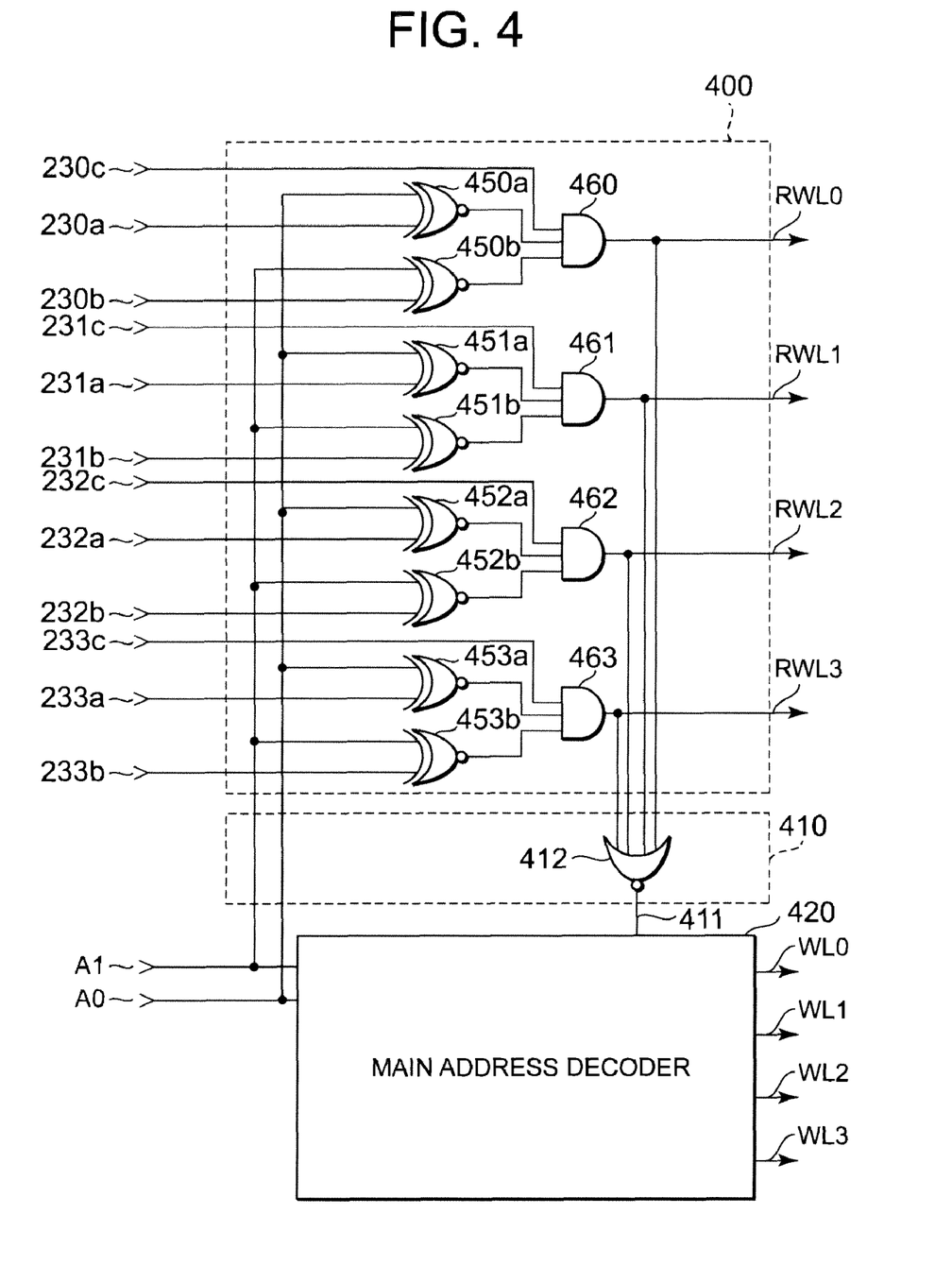
FIG. 4 is a replacement address setting circuit diagram of the first embodiment.

FIG. 4 is a detailed circuit diagram of the replacement address setting circuit 400, a circuit diagram of the decoder deactivation circuit 410, and a block diagram of the main address decoder 420.

The replacement address setting circuit 400 is configured of a three-input AND circuit 460, two-input XNOR circuits 450a and 450b, a three-input AND circuit 461, two-input XNOR circuits 451a and 451b, a three-input AND circuit 462, two-input XNOR circuits 452a and 452b, a three-input AND circuit 463, and two-input XNOR circuits 453a and 453b.

The address input A0 and the address fuse signals 230a, 231a, 232a, and 233a are connected to the two-input XNOR circuits 450a, 451a, 452a, and 453a, respectively. The address input A1 and the address fuse signals 230b, 231b, 232b, and 233b are connected to the two-input XNOR circuits 450b, 451b, 452b, and 453b, respectively. The outputs of the two-input XNOR circuits 450a and 450b and the enable fuse signal 230c are connected to the three-input AND circuit 460. The outputs of the two-input XNOR circuits 451a and 451b and the enable fuse signal 231c are connected to the three-input AND circuit 461. The outputs of the two-input XNOR circuits 452a and 452b and the enable fuse signal 232c are connected to the three-input AND circuit 462. The outputs of the two-input XNOR circuits 453a and 453b and the enable fuse signal 233c are connected to the three-input AND circuit 463. The outputs RWL0 to 3 of the three-input AND circuits 460 to 463 are connected to a four-input NOR circuit 412 of the decoder deactivation circuit 410. The main address decoder 420 is connected to the address inputs A0 and A1, and the output 411 of the four-input NOR circuit 412 from the decoder deactivation circuit 410.

Descriptions will be given of several-time replacement operations of the present invention with reference to FIGS. 1, 2, 3 and 4.

The block 250 of the fuse selection circuit 20 receives the enable fuse signal 230c and the address signals A0 and A1 externally inputted and outputs the cut selection signals 250a to 250c to the fuse circuit 21. The block 220 of the fuse circuit 21 takes the cut selection signals 250a to 250c and the cut trigger signal 204 as inputs and cuts a fuse selected by the cut selection signals 250a to 250c based on a one-shot high level input of the cut trigger signal 204. The output signals 230a to 230c of the block 220 are further connected to the replacement address setting circuit 400, too. As the above-mentioned blocks 250 and 220, the blocks 251 to 253 output the cut selection signals 251a to 251c, 252a to 252c, and 253a to 253c, and the blocks 221 to 223 output the output signals 231a to 231c, 232a to 232c, and 233a to 233c. The output signals 230a to 230c, 231a to 231c, 232a to 232c, 233a to 233c are compared with the address signals A0 and A1. If they agree with each other, one of the replacement address signals RWL0 to 3 is outputted at the high level, and the other signals is outputted at the low level. These signals are connected to the spare memory cell 11. Furthermore, the replacement address signals RWL0 to 3 are also inputted to the decoder deactivation circuit 410. If any one of the replacement address signals RWL0 to 3 is at the high level, the output signal 411 of the decoder deactivation circuit 410 is inputted as a non-selection signal to the main address decoder 420. Thereby, all the main address decoding signals WL0 to 3 are outputted at the low level, and the main memory cell 12 is put in a non-select state. If the replacement address signals RWL0 to 3 are all at the low level, the output signal 411 of the decoder deactivation circuit 410 is outputted at the high level. The main address decoder 420 receives the address signals A0 and A1 and outputs any one of the main address decoding signals WL0 to 3 at the high level.

Firstly, descriptions will be given of operations performed when a memory cell selected by the address signal (A0, A1)=(0, 1) fails in a first test. In this case, the semiconductor memory device in the embodiment inputs the address signal (A0, A1)=(0, 1) as the operations of the replacement redress mode state in the fuse selection circuit 20 in FIG. 2. Moreover, the cut trigger signal 204 is set to an initial value of the low level. The fuse circuit 220 holding a first replacement address is not cut in an initial state; therefore, the enable fuse signal 230c is outputted at the low level, and the fuse use ban signal 250c is outputted at the high level (cut permission). The two-input AND circuit 300c of the fuse circuit 220 and the two-input AND circuits 240a and 240b of the fuse selection circuit 250 are put in a select state. Since (A0, A1)=(0, 1) is inputted, the output signal 250a is at the low level, the output signal 250b is at the high level. Accordingly, the two-input AND circuits 300a and 300b are put in the non-select state and the select state, respectively. Then, when the cut trigger signal 204, being a permission signal to permit a fuse cut, transits to the high level at one shot, the n-channel transistors 320b and 320c selected by the two-input AND circuits 300b and 300c are switched on, responding to the transition in common. Accordingly, current flows through the electric fuses 310b and 310c, and the fuses are cut. As a result, the potential of the nodes 340b and 340c is at the low level afterwards.

Cutting a fuse for redressing a defective cell for the address signal (A0, A1)=(0, 1) has been shown as the first replacement redress process in this example. If two or more address signals need to be redressed, the same fuse cutting may be repeated, and each fuse cutting may be set as the first replacement redress process. Furthermore, the fuse element 310c that execute a program by being electrically cut, and the like are used in this example. Alternatively, it is also possible to use an antifuse element that is insulated in the initial state and becomes electrically conductive by feeding a large current. In this case, contrary to the example described here, the potential of the node 340c and the like of when replaced and when not replaced is at the low level at the beginning and is at the high level upon execution of the program. Therefore, the same circuit operations can be performed if the logic levels of the signal 230c and the like are set to be the same as the above example by appropriately making changes such as increasing the numbers of stages of the inverter 350c and the like.

The semiconductor memory device of the embodiment can perform normal read/write operations after completing the first fuse cutting in this manner and leaving the replacement redress mode, it is possible to perform normal reading/writing in response to external access to a replaced defective address by selecting a specific spare cell among spare cells after replacement. Moreover, after the first test or the first replacement redress, the semiconductor memory device can normally operate during any of operational states including other test operations, standby mode and shut-down. In this case, the fuse 310c and the like store replacement states in a nonvolatile manner; therefore, the memory of the replacement states will not be lost by the operational states such as the shut-down of the semiconductor device.

Next, descriptions will be given of operations performed when a memory cell selected by the address signal (A0, A1)=(0, 0) and (1, 0) fails in a second test. Since the electric fuse 310c is cut in the first test and the node 340c is at the low level due to the high resistor 330c with a resistance value of several KΩ to several MΩ, the enable fuse signal 230c of the fuse circuit 220c is outputted at the high level through the inverter 350c. Moreover, the fuse use ban signal 250c is outputted at the low level (cut ban). Consequently, the A0 and A1 cut selection signals 250a and 250b are also at the low level, and the fuse circuit 220 is put in the non-select state. Thereby, redundant fuse cutting is avoided. Since the electric fuse 311c is not cut, the enable fuse signal 231c of the second fuse circuit 221 is outputted at the high level and inputted to the two-input NOR circuit 261 of the fuse selection circuit 251 together with the fuse use ban signal 250c. The fuse use ban signal 251c is outputted at the high level (cut permission). The two-input AND circuits 241a and 241b are put in the select state. However, since the address signal (A0, A1)=(0, 0), the outputs 251a and 251b are at the low level, and the fuse use ban signal 251c is inputted at the high level to the fuse circuits 221a, 221b, and 221c. If the cut trigger signal 204 transits to the high level at one shot, only the electric fuse for the fuse circuit 221c is selected and cut. Then, the fuse circuit outputs 231a and 231b are outputted at the low level, and the enable fuse signal 231c is outputted at the high level. Since the enable fuse signal 231c is at the high level, the fuse use ban signal 251c is at the low level. Then, the two-input NOR circuit 261 is inputted, together with the fuse use ban signal 250c (low level), to the two-input OR circuit 271. The output 281 is at the low level. Next, when the address signal (A0, A1)=(1, 0) is inputted, the two-input AND circuits 242a and 242b in the third fuse circuit 252 are selected. Then, the A0 cut selection signal 252a is at the high level, and the A1 cut selection signal 252b is at the low level. In the fuse circuits 222a, 222b and 222c, when the cut trigger signal 204 is at the high level at one shot, electric fuses for 222a and 222c are selected. Then, the outputs 232a and 232b and the enable fuse signal 232c are outputted at the high level, the low level, and the high level, respectively.

At this point, when the A0 address fuse signal 230a and the A1 address fuse signal 230b agree with the external address signals A0 and A1 and the enable fuse signal 230c is at the high level in the replacement address setting circuit 400 in FIG. 4, the three-input AND circuit 460 is outputted at the high level, and sets RWL0 as a replacement address. Additionally, RWL0 is inputted to a four-input NOR circuit of the decoder deactivation circuit 410, and the output 411 is outputted at the low level. The output 411 is inputted to the main address decoder 420 to set the decoding signals WL0 to 3 of the external address signals A0 and A1 to non-select (low level). With respect to the replacement address setting circuit 400, the A0 address fuse signals 231a, 232a and 233a, and the A1 address fuse signals 231b, 232b and 233b, which hold the second to fourth replacement address, respectively, and the enable fuse signals 231c, 232c and 233c, are inputted similarly to the ones from the first block 220. When the respective signals agree with the external addresses A0 and A1, and the enable fuse signals 231c, 232c, and 233c are at the high level respectively, the replacement address signals RWL1 to 3 are set by the three-input AND circuits 461, 462 and 463. The output signal 411 of the decoder deactivation circuit 410 is at the low level, and the output signals WL0 to 3 of the main address decoder 420 are set to the non-select low level. The representation of (0, 1) in the above descriptions indicates (low level, high level).

As described above, in the illustrated several-time replacement control circuit, the cut/non-cut state output of a fuse circuit used for replacement redress is used as a fuse use ban signal. A fuse circuit used for replacement redress has a cut-state memory element that is cut by commonly responding to the cut trigger signal being a cut permission signal for cutting a fuse in relation to an address to be replaced, and generates a cut/non-cut state output. In addition, it is configured so that an OR of the fuse use ban signal and the fuse use ban signal of the selected fuse circuit, of a previous stage, is passed to a following stage. Accordingly, without any special dedicated fuse circuit, a fuse circuit in the following stage is selected only when all the fuse circuits in the previous stages are banned for use (have already been used). Consequently, a dedicated replacement information holding circuit, fuse selection circuit, and fuse selection address signal, which have all been necessary in the conventional example, are no longer necessary.

Figure 5:
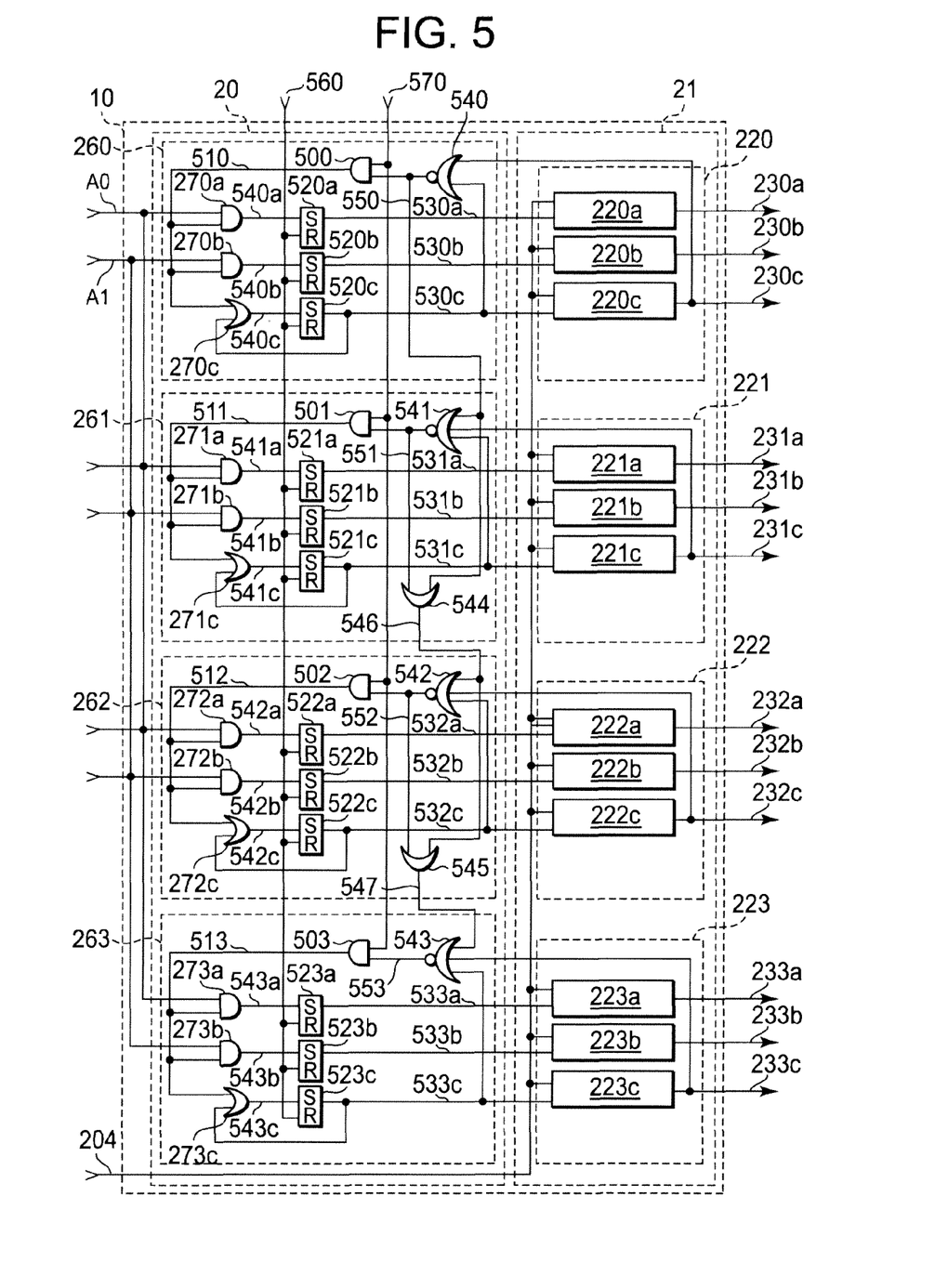
FIG. 5 is a replacement control circuit diagram showing a configuration of a second embodiment.

A second embodiment has a configuration in which an SR latch circuit to latch address signals A0 and A1, and an enable fuse signal is added to the configuration in FIG. 2 of the first embodiment. The other different point is to use, as a latch trigger signal, a one-shot judgment signal that uses a memory test pass/fail judgment result by BIST. FIG. 5 is a replacement control circuit diagram showing the second embodiment of the present invention.

The replacement control circuit of the second embodiment has the fuse selection circuit 20 and the fuse circuit 21 configured of fuse selection circuits 260, 261, 262, and 263, and circuit blocks 220, 221, 222, and 223, respectively. The circuit blocks 220 to 223 are configured of fuse circuits 220a to 220c, 221a to 221c, and 223a to 223c, respectively. The fuse selection circuit 260 is configured of two-input AND circuits 270a, 270b, and 500, a two-input NOR circuit 540, a two-input OR circuit 270c, and SR latch circuits 520a to 520c. The fuse selection circuit 261 is configured of two-input AND circuits 271a, 271b and 501, a three-input NOR circuit 541, two-input OR circuits 271c and 544, and SR latch circuits 521a to 521c. The fuse selection circuit 262 is configured of two-input AND circuits 272a, 272b, and 502, a three-input NOR circuit 542, two-input OR circuits 272c and 545, and SR latch circuits 522a to 522c. The fuse selection circuit 263 is configured of two-input AND circuits 273a, 273b and 503, a three-input NOR circuit 543, a two-input OR circuit 273c, and SR latch circuits 523a to 523c.

The address signal A0 externally inputted is connected to the two-input AND circuits 270a, 271a, 272a and 273a. The address signal A1 is connected to the two-input AND circuits 270b, 271b, 272b, and 273b. A cut trigger signal 204 is connected to the fuse circuits 220a to 220c, 221a to 221c, 222a to 222c, and 223a to 223c. A reset signal 560 is connected to a reset side of the SR latch circuits 520a to 520c, 521a to 521c, 522a to 522c, and 523a to 523c, and a one-shot judgment signal 570 is connected to the two-input AND circuits 500, 501, 502 and 503.

The fuse selection circuit 260 and the fuse circuit 220 hold a first replacement address; The fuse selection circuit 261 and the fuse circuit 221 hold a second replacement address; the fuse selection circuit 262 and the fuse circuit 222 hold a third replacement address; and the fuse selection circuit 263 and the fuse circuit 223 hold a fourth replacement address. In the fuse selection circuit 260 and the circuit block 220, outputs 540a to 540c of the two-input AND circuits 270a and 270b and the two-input OR circuit 270c are inputted to set sides of the SR latch circuits 520a to 520c, and outputs 530a to 530c are connected to the fuse circuits 220a to 220c, respectively. The SR latch circuit 520c is connected to the two-input NOR circuit 540 and the two-input OR circuit 270c. An output enable fuse signal 230c of the fuse circuit 220c, together with the output 530c of the SR latch circuit 520c, is connected to the two-input NOR circuit 540. An output 550 is connected to the two-input AND circuit 500, and the three-input NOR circuit 541 and the two-input OR circuit 544 of the fuse selection circuit 261. An output 510 of the two-input AND circuit 500 is connected to the two-input AND circuits 270a and 270b and the two-input OR circuit 270c. In the fuse selection circuit 261 and the fuse block 221, outputs 541a to 541c of the two-input AND circuits 271a and 271b and the two-input OR circuit 271c are inputted to set sides of the SR latch circuits 521a to 521c, and outputs 531a to 531c are connected to the fuse circuits 221a to 221c, respectively. The SR latch circuit 521c is connected to the three-input NOR circuit 541 and the two-input OR circuit 271c. An output enable fuse signal 231c of the fuse circuit 221c, together with the output 531c of the SR latch circuit 521c, is connected to the three-input NOR circuit 541. An output 551 is connected to the two-input AND circuit 501 and the two-input OR circuit 544, and an output 546 of the two-input OR circuit 544 is connected to the three-input NOR circuit 542 and the two-input OR circuit 545 of the fuse selection circuit 262. An output 511 of the two-input AND circuit 501 is connected to the two-input AND circuits 271a and 271b, and the two-input OR circuit 271c. In the fuse selection circuit 262 and the circuit block 222, outputs 542a to 542c of the two-input AND circuits 272a and 272b, and the two-input OR circuit 272c are connected to set sides of the SR latch circuits 522a to 522c, and outputs 532a to 532c are connected to the fuse circuits 222a to 222c, respectively. The SR latch 522c is connected to the three-input NOR circuit 542 and the two-input OR circuit 272c. An output enable fuse signal 232c of the fuse circuit 222c, together with the output 532c of the SR latch circuit 522c, is connected to the three-input NOR circuit 542. An output 552 is connected to the two-input AND circuit 502 and the two-input OR circuit 545, and output 547 of the two-input OR circuit 545 is connected to the three-input NOR circuit 543 of the fuse selection circuit 263. An output 512 of the two-input AND circuit 502 is connected to the two-input AND circuits 272a and 272b, and the two-input OR circuit 272c.

In the fuse selection circuit 263 and the circuit block 223, outputs 543a to 543c of the two-input AND circuits 273a and 273b, and the two-input OR circuit 273c are inputted to set sides of the SR latch circuits 523a to 523c, and their outputs 533a to 533c are connected to the fuse circuits 223a to 223c, respectively. The SR latch circuit 523c is connected to the three-input NOR circuit 543 and the two-input OR circuit 273c. An output enable fuse signal 233c of the fuse circuit 223c, together with the output 533c of the SR latch circuit 523c, is connected to the three-input NOR circuit 543. An output 553 is connected to the two-input AND circuit 503. An output 513 of the two-input AND circuit 503 is connected to the two-input AND circuits 273a and 273b, and the two-input OR circuit 273c. The fuse circuits 220 to 223 have the same configurations as the first embodiment.

Descriptions will be given of several-time replacement operations of the second embodiment with reference to FIG. 5.

Firstly, descriptions will be given of operations performed when a memory cell selected by an address signal (A0, A1)= (0, 1) fails in a first test. As an initial operation, a one-shot high level is outputted from the reset signal 560 to reset the SR latch circuits 520a to 520c, 521a to 521c, 522a to 522c, and 523a to 523c, and to set the output signals 530a to 530c, 531a to 531c, 532a to 532c, and 533a to 533c to the low level. In addition, an electric fuse of the fuse circuit is in a non-cut state, the enable fuse signals 230c to 233c are at the low level, and the output 550 of the two-input NOR circuit 540 of the fuse judgment circuit 260 is at the high level. When a memory cell selected by the address signal (A0, A1)=(0, 1) is at the high level, the one-shot judgment signal 570 is at the one-shot high level, the output 510 of the two-input AND circuit 500 is at the high level, the output signal 540a of the two-input AND circuits 270a and 270b for the address signals A0 and A1 are the low level, the output signal 540b is at the high level, and the output signal 540c of the two-input OR circuit 270c is at the high level. The output signal 530a of the SR latch circuits 520a, 520b and 520c are set at the low level, the output signal 530b at the high level, and the output signal 530c at the high level. The two-input AND circuit 300a is put in a non-select state, 300b in a select state, and 300c in the select state. When the cut trigger signal 204 transits to the high level at one shot, n-channel transistors 320b and 320c selected by the two-input AND circuits 300b and 300c are switched on to feed current through electric fuses 310b and 310c, and the fuses are cut.

Next, descriptions will be given of operations performed when a main memory cell selected by the address signals (A0, A1)=(0, 0) and (1, 0) is defective in a second test. Since an electric fuse 310c is cut in the first test and a node 340c is at the low level due to a high resistor 330c, the enable fuse signal 230c of the fuse circuit 220c is outputted at the high level through an inverter 350c. The fuse use ban signal 550 is at the low level (cut ban), and the output 510 is at the low level (cut ban). The A0 and A1 cut selection signals 540a and 540b are also at the low level due to the output 510, and the fuse circuit 220 is put in the non-select state. Accordingly, the redundant fuse cutting is avoided. The enable fuse signal 231c of the second fuse circuit 221 is outputted at the low level since the electric fuse 310b is not cut, and is inputted to the three-input NOR circuit 541 of the fuse selection circuit 261 together with the output signal 531c (low level) and the fuse use ban signal 550 (low level). The output 551 is outputted at the high level (cut permission). When the one-shot judgment signal 570 is outputted at a one-shot high level, the output 511 of the two-input AND circuit 501 is at the high level; the output signals 541a and 541b of the two-input AND circuits 271a and 271b for the address signals A0 and A1 is at the low level; and the output signal 541c of the two-input OR circuit 271c is at the high level. Consequently, the output signal 531a of the SR latch circuits 521a, 521b and 521c is set at the low level, the output signal 531b at the low level, and the output signal 531c at the high level. 221a of the fuse circuit 221 is put in the non-select state, 221b in the non-select state, and 221c in the select state. A fuse selected by the cut trigger signal 204 is cut here in FIG. 2 of the first embodiment. In the second embodiment, on the other hand, the cut trigger signal 204 need not be cut until the end of the second test since the 531a, 531b and 531c signals are latched by the SR latch circuits. Next, when a memory cell selected by the address signal (A0, A1)=(1, 0) is at the high level, the signal 546, the enable fuse signal 232c, and the fuse use ban signal 532c are inputted all at the low level to the three-input NOR circuit 542 in the fuse circuit 262. Thereby, an output 552 is at the high level. When the one-shot judgment signal 570 is outputted at a one-shot high level, the output 512 of the two-input AND circuit 502 is at the high level, the output signal 542a of the two-input AND circuits 272a and 272b for the address signals A0 and A1 is at the high level, the output signal 542b is at the low level, and the output signal 542c of the two-input OR circuit 272c is at the high level. Then, the output signal 532a of the SR latch circuits 522a, 522b and 522c is set at the high level, the output signal 532b at the low level, and the output signal 532c at the high level.

When the input of the cut trigger signal 204 is changed at the one-shot high level after the end of the second test, fuses selected by the input signals 531c, 532a and 532c are simultaneously cut in the fuse selection circuits 221 and 222.

As described above, a circuit that latches the address A0 and A1 signals and the enable fuse signal is provided in the second embodiment. Thereby, cutting data can be held for each fuse set even if fuse cutting is not performed, and fuse cutting operations are performed once at the end of the test. The conventional technique has required a replacement information holding circuit and a fuse selection circuit, both of which are dedicated for changing the order of fuse selection, and an address signal for fuse selection. However, in this embodiment, selection of the next fuse is made based on the replacement fuse cutting information of a replacement control circuit to be selected. Accordingly, there is no longer a need to have a dedicated replacement information holding circuit and a dedicated fuse selection circuit, and an address signal (BSEL) for fuse selection. Thereby, a small chip size can be accomplished. When comparing the same configuration examples, for example, the necessary number of fuses 4×4 sets+2=18 pieces is reduced to the number of fuses 3×4 sets=12 pieces, according to the embodiment. As a result, the number of fuses decreases to $12/18$, which results in a size reduction effect of 67%.

What is claimed is:

1. A control circuit receiving an address signal, comprising:
    a first fuse circuit including a first fuse element and a first another fuse element, the first fuse circuit outputting a first control signal based on the first another fuse;
    a second fuse circuit including a second fuse element and a second another fuse element, the second fuse circuit outputting a second control signal based on the second another fuse;
    a fuse selection circuit configured to output a cut selection signal to one of the first and the second fuse circuits based on the address signal, the first control signal and the second control signal.

2. The control circuit according to claim 1 further receiving a trigger signal,
    wherein each of the first and the second fuse circuits records a fuse element indicated by the cut selection signal in response to the trigger signal.

3. The control circuit according to claim 2,
    wherein the first and the second another fuse elements are configured to record recording status of the first and the second fuse circuits.

4. The control circuit according to claim 3,
    wherein the first fuse element and the second fuse element are configured to record information corresponding to the address signal.

5. A semiconductor device comprising:
    a first fuse circuit having a first plurality of fuse elements and a first another fuse element, the first fuse circuit outputting a first control signal based on the first another fuse;
    a second fuse circuit having a second plurality of fuse elements and a second another fuse element, the second fuse circuit outputting a second control signal based on the second another fuse;
    a fuse selection circuit receiving an address signal, the first control signal and the second control signal to output a cut selection signal indicating a fuse to be cut to one of the first and the second fuse circuits.

6. The semiconductor device according to claim 5,
    wherein each of the first and the second fuse circuits records a fuse element indicated by the cut selection signal in response to a trigger signal.

7. The semiconductor device according to claim 6,
    wherein the first and the second another fuse elements are configured to record recording status of the first and the second fuse circuits.

8. The semiconductor device according to claim 7,
    wherein the first and the second plurality of fuse elements are configured to record information corresponding to the address signal.

* * * * *